United States Patent
Tanaka et al.

(10) Patent No.: US 6,992,813 B1
(45) Date of Patent: Jan. 31, 2006

(54) OPTICAL AMPLIFYING DEVICE

(75) Inventors: Shinsuke Tanaka, Kawasaki (JP); Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/117,432

(22) Filed: Apr. 29, 2005

(30) Foreign Application Priority Data

Dec. 28, 2004 (JP) .............................. 2004-380832
Dec. 28, 2004 (JP) .............................. 2004-380833

(51) Int. Cl.
*H01S 3/00* (2006.01)
(52) U.S. Cl. ...................................... 359/333; 359/326
(58) Field of Classification Search ................ 359/333, 359/349, 326
See application file for complete search history.

(56) References Cited

U.S. PATENT DOCUMENTS 6,069,732 A * 5/2000 Koch et al. .................. 359/344
6,678,086 B2 * 1/2004 Dave et al. ................... 359/326
6,727,991 B2 * 4/2004 Martinez et al. ............. 356/477

FOREIGN PATENT DOCUMENTS

| JP | 2000012978 A | * | 1/2000 |
| JP | 2003-152273 | | 5/2003 |
| JP | 2003-179289 | | 6/2003 |

* cited by examiner

*Primary Examiner*—Mark Hellner
(74) *Attorney, Agent, or Firm*—Armstrong, Kratz, Quintos, Hanson & Brooks, LLP

(57) ABSTRACT

In order to realize continuous gain control while realizing polarization independent amplifying characteristic, an optical amplifying device is configured to include: a Mach-Zehnder interferometer including an input side coupler, an output side coupler and a pair of arms, that connects the input side coupler to the output side coupler; a first and a second optical amplifier, to amplify signal light, which are disposed on the pair of arms respectively; and a light source for control light to output control light, in which the first and the second optical amplifier are configured to have polarization independent characteristic and the light source for control light is configured to have a predetermined polarization dependent gain difference or a predetermined polarization dependent loss difference.

22 Claims, 8 Drawing Sheets

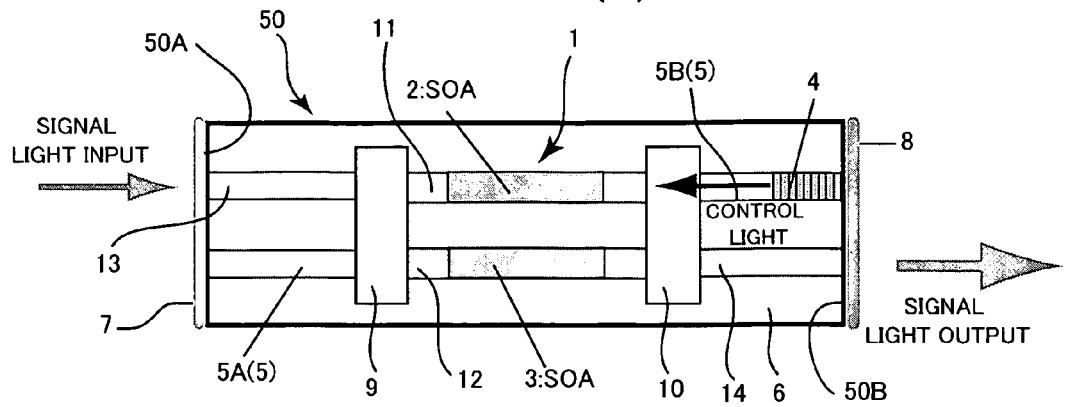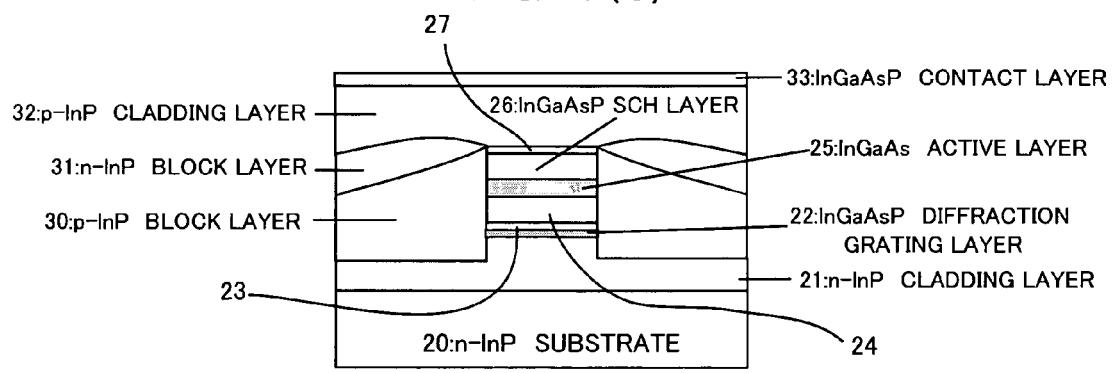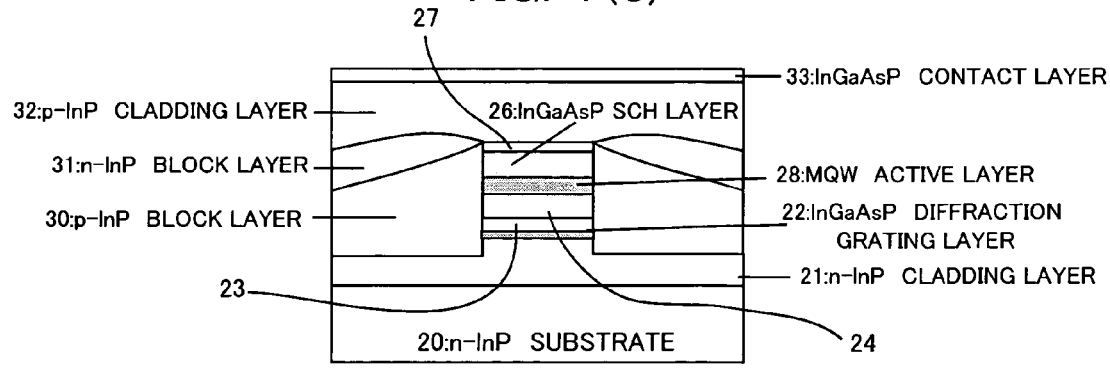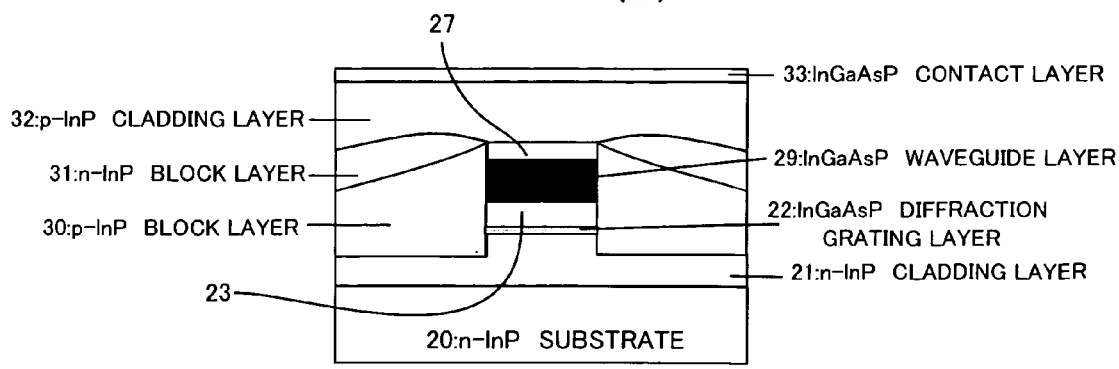

OPTICAL AMPLIFYING DEVICE

CROSS REFERENCE TO RELATED APPLICATIONS

This application is based on and hereby claims priorities to Japanese Application No. 2004-380833 and No. 2004-380832 both filed on Dec. 28, 2004 in Japan, the contents of which are hereby incorporated by reference.

BACKGROUND OF THE INVENTION (1) Field of the Invention

The present invention relates to an optical amplifying device which is capable of controlling gain of signal light by, for example, introducing a control light, and which is preferably utilized for a semiconductor optical amplifying device.

(2) Description of Related Art

As demand for communications increases dramatically in recent years, scope of application of large capacity and high speed photonic network is spreading to metropolitan access system which is close to subscribers. The photonic network applicable to the metropolitan access system has flexible network structure in which optical add drop multiplexer (OADM) and the like are utilized.

For the optical amplifier utilized in the network of this kind, function by which high speed gain control (level control function) can be performed against variation in number of multiplied wavelengths and variation in intensity of input light to get constant light output at any time is required.

As for the optical amplifier device with level control function, for example, as shown in FIG. 10, an amplifier which is configured in such a manner that semiconductor optical amplifiers (SOA) 103, 104 are disposed respectively in both arms 101, 102 of a Mach-Zehnder interferometer 100 which includes 3 dB couplers 107, 108, and a control SOA 105 is integrated outside of the interferometer 100, has been proposed (For example, see Japanese Patent Laid-Open No. 2003-179289).

In this optical amplifier, signal light is amplified by the SOAs 103, 104 which are disposed in both arms 101, 102 of the Mach-Zehnder interferometer 100. Further, laser oscillation occur in the device by means that: a light path for oscillation light (control light) is arranged in the device such that it intersects with a light path for the signal light, and reflection preventing film (reflection mirror) 106 which has reflection coefficient about 0.1% and a gain medium such as SOA are disposed on light path for the oscillation light, as feedback mechanism. Here, as for other feedback mechanism, a diffraction grating, a loop waveguide and the like are also disclosed. In this case, SOAs 103, 104 in the arms 101, 102 also contribute to the laser oscillation of oscillation light, and gain for signal light is arranged to constantly be held (clamped) in gain for oscillation light at oscillation threshold (threshold gain). Further, in this optical amplifier, threshold gain of the SOAs 103, 104 in the both arms 101, 102 are changed by means of adjustment of gain of the control SOA 105 which is disposed outside of the interferometer, thereby gain control of the optical amplifier is accomplished.

Especially in the optical amplifier disclosed by the Japanese Patent Laid-Open No. 2003-179289, at a time point when gain of the oscillation light in one way becomes a reciprocal number of residual reflection coefficient at end face, the oscillation begins and the gain is clamped. If residual reflection coefficient of the reflection preventing film is 0.1%, at a time point when sum of gains of the SOAs 103, 104 in the arms 101, 102 and gain of the control SOA 105 becomes 30 dB, the gain is clamped. Therefore, it is described that as gains of the SOAs 103, 104 in the arms 101, 102 are clamped at 20 dB if gain of the control SOA 105 is set to 10 dB, gain of the SOAs 103, 104 in the arms 101, 102 are adjusted by means of the gain control of the control SOA 105 (See, for example, paragraph numbers 0046 and 0047).

SUMMARY OF THE INVENTION

By the way, for optical amplifier utilized in the photonic network, a polarization independent amplifying characteristic that gain is not affected by polarization state of the signal light, is required.

In the proposed conventional optical amplifier described above (See FIG. 10), the polarization independent amplifying characteristic to the signal light can be realized by means of utilizing polarization independent amplifying type SOA for SOAs in the arms.

Further, for the conventionally proposed conventional optical amplifier described above (See FIG. 10), it is usual that the SOAs disposed in the arms and the control SOA disposed outside of the interferometer are arranged to have common active layer. By this reason the control SOA outside of the interferometer is also to have the polarization independent amplifying characteristic.

However, in the conventionally proposed conventional optical amplifier above described (See FIG. 10), because it is arranged such that gain becomes constant value by means of oscillation and utilizing the control SOA having polarization independent amplifying characteristic, a mode hopping of the control light (oscillation light) in oscillating state tends to occur, and based on this mode hopping a kink is caused. By this manner, if the kink is caused while gain is controlled, gain of the optical amplifier (light gain) is not smoothly changed to control current, and continuous gain control becomes hard to be attained. At the same time control circuit becomes complicated.

By the way as for the optical amplifier with level control function, for example, as shown in FIG. 11, an amplifier which is configured in such a manner that SOAs 113, 114 are disposed respectively in both arms 111, 112 of a Mach-Zehnder interferometer 110 which includes 3 dB couplers 116, 117, and a DFB laser 115 as control laser light source is integrated outside of the interferometer 110 is also proposed (For example, see Japanese Patent Application No. 2004-508538). On end faces of this optical amplifier, a anti-reflection coating (reflection coefficient<0.001%) is applied and anti-reflection coating films 118, 119 are formed.

In this optical amplifier, signal light is amplified by the SOAs 113, 114 which are disposed in both arms 111, 112 of the Mach-Zehnder interferometer 110. On the other hand, control light which is output from the DFB laser 115 disposed outside of the interferometer 110 is input to both SOAs 113, 114 and to be amplified, then to be guided in the device in a direction which is diagonal to that of the signal light. Utilizing a mutual gain modulation effect between the control light and the signal light by means of power adjustment of the control light output from the DFB laser 115, gain control of the optical amplifier is arranged to be accomplished.

However, in the optical amplifier of this kind of structure, there is similar problem to the above described optical amplifier (See FIG. 10). That is, it is also usual that the DFB laser 115 is made to have common active layer with the SOAs 113, 114 in the optical amplifier of this kind of structure. By this reason the DFB laser 115 also has the polarization independent amplifying characteristic as well as the SOAs. At the same time, it is arranged such that gain becomes constant value by means of oscillation. In this case a mode hopping of the control light in an oscillating state tends to occur while gain control is performed by means of control light power adjustment such that injection current (control current) to the DFB laser 115 is varied, and based on this mode hopping a kink is caused [See FIG. 12]. As described above, if the kink is caused when the gain is controlled, gain of the optical amplifier (light gain) is not smoothly changed to the control current, thereby continuous gain control becomes hard to be attained. At the same time control circuit also becomes complicated.

The present invention is made to solve the above described problems, and an object of the present invention is to provide an optical amplifier by which the continuous gain control can be realized while the polarization independent amplifying characteristic is realized.

To attain the object, the optical amplifier in accordance with the present invention includes a symmetrical Mach-Zehnder interferometer including an input side coupler, an output side coupler and a pair of arms that connect the input side coupler and the output side coupler, first and second optical amplifier to amplify signal light, which are disposed in the pair of arms respectively, a light source for control right to output control light, and the first and the second optical amplifier are configured to have polarization independent characteristics, and the light source for control light is configured to have at least one of a predetermined polarization dependent gain difference and a predetermined polarization dependent loss difference.

The optical amplifier according to the present invention also includes a symmetrical Mach-Zehnder interferometer including an input side coupler, an output side coupler and a pair of arms that connect the input side coupler and the output side coupler, first and second optical amplifier to amplify signal light, which are disposed on the pair of arms respectively, a light source for control right to output control light, and the first and the second optical amplifier are configured to have their polarization dependent gain difference ΔG that is smaller than 2 dB, respectively, and the light source for control light is configured to have its normalized polarization dependent gain difference ΔαL that is not smaller than 0.15.

Further, the optical amplifier according to the present invention includes a symmetrical Mach-Zehnder interferometer including an input side coupler, an output side coupler and a pair of arms that connect the input side coupler and the output side coupler, first and second optical amplifier to amplify signal light, which are disposed on the pair of arms respectively, a light source for control right to output control light without utilizing oscillation, and a waveguide for control light connected to the symmetrical Mach-Zehnder interferometer for guiding control light which is output from the light source for control light, and light gain that is, obtained by the control light when the control light is guided through the waveguide for control light and the symmetrical Mach-Zehnder interferometer, is configured to be smaller than light loss obtained by the control light.

Therefore, according to the present invention, there is produced an advantage that continuous gain control can be realized while the polarization independent amplifying characteristic is realized.

BRIEF DESCRIPTION OF THE DRAWINGS

FIG. 1(a) to FIG. 1(d) are schematic diagrams to show structure of an optical amplifier in accordance with Embodiment 1 of the present invention, in which FIG. 1(a) is a plan view of the device, FIG. 1(b) is a cross sectional view to show structure of SOA, FIG. 1(c) is a cross sectional view to show structure of DFB laser and FIG. 1(d) is a cross sectional view to show structure of light waveguide.

FIG. 8(a) to FIG. 8(c) are schematic diagrams to show structure of an optical amplifier in accordance with Embodiment 4 of the present invention, in which, FIG. 8(a) is a plan view, FIG. 8(b) is a cross sectional view to show structure of SOA and ASE light source, and FIG. 8(c) is a cross sectional view to show light waveguide.

DESCRIPTION OF THE PREFERRED EMBODIMENTS

Figure 2:
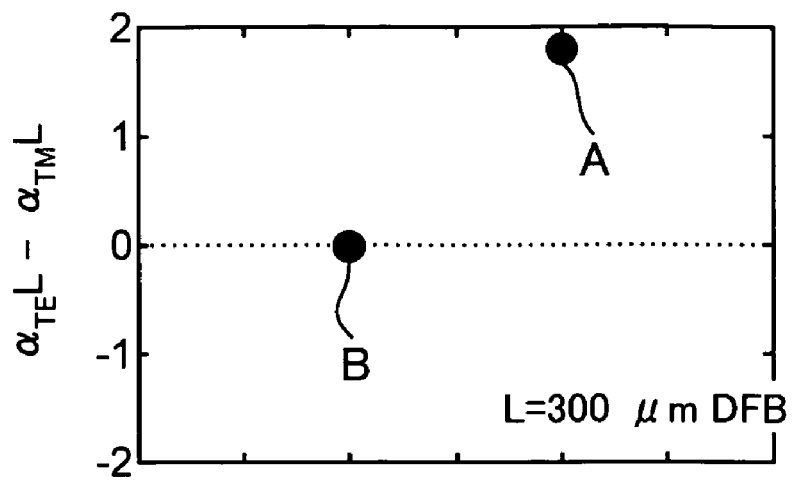
FIG. 2 is a diagram to explain polarization dependent gain difference in DFB laser utilized in the optical amplifier in accordance with Embodiment 1 of the present invention.

Hereinafter explanation on the optical amplifying devices in accordance with Embodiments of the present invention will be described with reference to drawings.

At first, in the optical amplifying devices in accordance with Embodiment 1 to Embodiment 3 of the present invention, by an arrangement in that two optical amplifiers which have polarization independent characteristic are disposed in arms of a symmetrical Mach-Zehnder interferometer. On the other hand, since a light source for control right which has polarization dependent gain difference or polarization dependent loss difference is disposed outside of the interferometer, a mode hopping between polarization modes is prevented, thereby a kink caused based on the mode hopping between polarization modes is also prevented.

Embodiment 1

An explanation on the optical amplifying device in accordance with Embodiment 1 of the present invention will be given with reference to FIG. 1(a) to FIG. 1(d).

The optical amplifying device is a semiconductor optical amplifying device which has a function of gain control utilizing injection of control light, and which is composed of a symmetrical Mach-Zehnder interferometer 1, two semiconductor optical amplifiers (SOA; first and second optical amplifier) 2, 3 that amplify signal light, a DFB laser (light source for control light, laser light source for control) 4 that outputs control light, and a waveguide 5 for control light that is configured to guide the control light output from the DFB (Distributed Feed Back) laser 4, and all of those are integrated in monolithic on the same semiconductor substrate 6, as shown in FIG. 1(a).

Further, in this Embodiment, each of end faces (end face of input side for signal light and end face of output side for signal light) 50A, 50B of a device 50 is covered with anti-reflection coating, respectively. That is, on both end faces 50A, 50B of the device 50, anti-reflection coating films 7, 8 (reflection coefficient R; R<0.001%) are formed respectively, as shown in FIG. 1(a).

Here, the symmetrical Mach-Zehnder interferometer 1 has a symmetrical structure and is composed of two 3 dB couplers (for example, 2×2 3 dB couplers) 9, 10, and a pair of arms 11, 12 which are connected to the 3 dB couplers and which have the same length of light path, as shown in FIG. 1(a). In the two 3 dB couplers one coupler which is disposed in input side of signal light is referred to as an input side 3 dB coupler (input side coupler) 9, and the other coupler which is disposed in output side of signal light is referred to as an output side 3 dB coupler (output side coupler) 10.

And the polarization independent type SOAs 2, 3 are disposed in the pair of arms 11, 12 respectively, as shown in FIG. 1(a). That is, the two SOAs 2, 3 which have polarization independent characteristic are disposed inside of the symmetrical Mach-Zehnder interferometer 1. These SOAs 2, 3 are configured to have the same length (same SOA length).

Further, to the symmetrical Mach-Zehnder interferometer 1, an input waveguide 13 to input signal light and an output waveguide 14 to output signal light are connected respectively as shown in FIG. 1(a). That is, the input waveguide 13 is connected to the input side 3 dB coupler 9 of the Mach-Zehnder interferometer 1, and the output waveguide 14 is connected to the output side 3 dB coupler 10 of the Mach-Zehnder interferometer 1. As a phase condition in both arms 11, 12 are the same (functionally symmetrical) in the Mach-Zehnder interferometer 1, the signal light input from the input waveguide 13 is arranged to be output from the output waveguide 14 which is disposed in a symmetrical position.

Still further, to the symmetrical Mach-Zehnder interferometer 1, the waveguide 5 for control light is connected, as shown in FIG. 1(a). This waveguide 5 for control light has a waveguide portion (input side portion) 5A which is connected to the input side 3 dB coupler 9 and a waveguide portion (output side portion) 5B which is connected to the output side 3 dB coupler 10, as shown in FIG. 1(a). The control light is arranged to be input from the output side portion 5B and to be output from the input side portion 5A which is disposed in a symmetrical position. Here, the control light is arranged to propagate in the inverse direction to the input light, and a route (light path) in which the signal light propagates intersect with a route (light path) in which the control light is propagate, each other.

Further, the input side portion 5A of waveguide 5 for the control light extends to the end face 50A of signal light input side of the device 50, and the output side portion 5B of waveguide 5 for the control light extends to the end face 50B of signal light output side of the device 50. As above described, because the anti-reflection coating films 7, 8 are formed on both end faces 50A, 50B of the device 50, it is resulted that the anti-reflection coating films 7, 8 are formed on both end faces of the waveguide 5 (5A, 5B) for control light.

The DFB laser 4 which utilizes laser oscillation as light source for control light is disposed at the waveguide portion 5B which is connected to the output side 3 dB coupler 10 of waveguide 5 for control light. That is, the DFB laser 4 is disposed outside of the symmetrical Mach-Zehnder interferometer 1.

When the control light which is output from the DFB laser 4 is input to the SOAs 2, 3 in the arms 11, 12, a mutual gain modulation effect is generated between the signal light. By utilizing this effect, gain of signal light by the SOAs 2, 3 can be suppressed.

Therefore, gain control of SOAs 2, 3 can be realized by changing of light amount of the control light input into the SOAs 2, 3 by means of injection current control and the like to the DFB laser 4.

By the way, in this Embodiment, the SOAs 2, 3 are configured to have strained bulk active layer 25 (InGaAs layer, for example, strain amount −0.24%, for example, 50 nm thickness) with strained bulk structure, as shown in FIG. 1(b) and FIG. 1(c). That is, the SOAs 2, 3 are configured to be polarization independent type optical amplifiers which have polarization independent characteristic.

Here, the polarization independent type SOAs 2, 3, denote SOA in which polarization dependent gain difference $\Delta G$ (dB) is smaller than a predetermined value (for example, $\Delta G$<2 dB; within several dB).

On the other hand, the DFB laser 4 is configured to have strained MQW active layer 28 (for example, stain amount +0.8%; for example thickness 50 nm) with strained Multiple Quantum Well (MQW) structure. This is arranged to enable intentionally making larger polarization dependent gain difference by designing of the strained MQW structure. The strained MQW active layer 28 may be formed by a material such as InGaAsP related material, however other material may be used.

By these arrangement, the DFB laser 4 as the light source for control light is configured to have a predetermined polarization dependent gain difference. Here, when length of the DFB laser 4 (resonator length) is L, and a material polarization dependent gain difference is $\Delta \alpha$ ($\alpha_{TE}-\alpha_{TM}$; unit cm$^{-1}$), then normalized polarization dependent gain difference of the DFB laser 4 can be denoted in $\Delta \alpha L$ ($=\alpha_{TE}L-\alpha_{TM}L$) In this Embodiment the normalized polarization dependent gain difference $\Delta \alpha L$ of the DFB laser 4 is arranged to be a predetermined value (about 0.15) or more ($\Delta \alpha L \geq 0.15$) in order to prevent the mode hopping between polarization at the DFB laser 4. By means of selection of material or layer structure of the strained MQW active layer 28, the polarization dependent gain difference can be arbitrarily set.

For example, FIG. 2 shows the gain difference $\Delta \alpha L$ between gain $\alpha_{TE}L$ of TE mode and gain $\alpha_{TM}L$ of TM mode ($=\alpha_{TE}L - _{Tm}L$) when length L of the DFB laser 4 (resonator length) is 300 $\mu$m (which is normalized by resonator length).

In FIG. 2, point A denotes the gain difference $\Delta\alpha L$ in a case when active layer of the DFB laser 4 is strained MQW structure (stain amount +0.8%), and point B denotes the gain difference $\Delta\alpha L$ in a case when active layer of the DFB laser 4 is strained bulk active layer (stain amount –0.24%).

In a case when active layer of the DFB laser 4 is strained bulk active layer (stain amount –0.24%) as shown by point B in FIG. 2, the gain difference $\Delta\alpha L$ between both polarization modes is almost 0 (zero), while in a case when active layer of the DFB laser 4 is strained MQW active layer (stain amount +0.8%) as shown by point A in FIG. 2, the gain difference $\Delta\alpha L$ between both polarization mode becomes about 1.7, it shows that large polarization dependent gain difference can be obtained.

In this Embodiment active layers (gain mediums) of the SOAs 2, 3 and active layer (gain medium) of the DFB laser 4 are arranged to be different in structure with each other. By this reason thickness and strain amount of these are also arranged to be different from each other. Here, as for material, it can be different with each other or it may be the same.

When active layers (gain mediums of the SOAs 2, 3 and active layer (gain medium) of the DFB laser 4 are arranged to be the same in structure (for example, both of them are strained bulk structure), and they are arranged to be different in material (for example, InGaAs are used for active layers of the SOAs 2, 3, and InGaAsP is used for active layer of the DFB laser 4), a predetermined polarization dependent gain difference can be also obtained.

Hereinafter, a relation between above described polarization dependent gain difference $\Delta G$ of the SOAs 2, 3 and the normalized polarization dependent gain difference $\Delta\alpha L$ of the DFB laser 4 will be explained.

When the SOAs 2, 3 and the DFB laser 4 have common active layers that show the material polarization dependent gain difference $\Delta\alpha$ ($\alpha_{TE}-\alpha_{TM}$; unit cm$^{-1}$), length of the SOAs 2, 3 are $L_{SOA}$ (cm), and length of the DFB laser 4 is $L_{DFB}$ (cm), polarization dependent gain difference $\Delta G$ of the SOAs 2, 3 and normalized polarization dependent gain difference $\Delta\alpha L$ of the DFB laser 4 can be described as below formula.

$$\Delta G = 4.34 * (L_{SOA}/L_{DFB}) * \Delta\alpha L_{DFB}$$

$$\Delta\alpha L = \Delta\alpha L_{DFB}$$

As known by these formulas, to polarization dependent gain difference $\Delta G$ of the SOAs 2, 3, ratio of length $L_{SOA}$ of the SOAs 2, 3 to length $L_{DFB}$ of the DFB laser 4 ($L_{SOA}/L_{DFB}$) relates other than the normalized polarization dependent gain difference $\Delta\alpha L_{DFB}$ of active layer.

Here, because the polarization dependent gain difference $\Delta G$ of the SOAs 2, 3 determines final characteristic of the device, it is required that the polarization dependent gain difference $\Delta G$ of the SOAs 2, 3 is arranged to become less than, for example, 2 dB ($\Delta G<2$ dB) by means of total designing containing not only the active layer structure but also length of the SOAs 2, 3 $L_{SOA}$ and length of the DFB laser 4 $L_{DFB}$.

For example, when the SOAs 2, 3 and the DFB laser 4 have common active layer, if conditions are set as general length, $L_{DFB}=0.03$ cm and $L_{SOA}=0.15$ cm (in this case length of the SOAs 2, 3 becomes about several times of those of the DFB laser 4), and normalized polarization dependent gain difference $\Delta\alpha L$ of the DFB laser 4 becomes 0.15 or more ($\Delta\alpha L \geq 0.15$), polarization dependent gain difference $\Delta G$ of the SOAs 2, 3 becomes more than 3.3 dB ($\Delta G>3.3$ dB), and the polarization independent characteristic cannot be obtained. Of course, if length of the SOAs 2, 3 is arranged to become extraordinary short, the polarization dependent gain difference $\Delta G$ can be smaller than 2 dB ($\Delta G<2$ dB), in this case it is not realistic because light gain of the SOAs 2, 3 becomes fairly small.

The present invention defines the SOAs 2, 3 which has the polarization independent characteristic that polarization dependent gain difference $\Delta G$ of the SOAs should be smaller than a predetermined value (for example, 2 dB) as described above (for example, $\Delta G<2$ dB; within several dB).

On the other hand, the present invention defines the DFB laser 4 which has the polarization dependent gain difference that the normalized polarization dependent gain difference of the DFB laser 4 should be a predetermined value or more (for example, 0.15) ($\Delta\alpha L \geq 0.15$).

As described above, when the DFB laser 4 as the light source of control light is configured to have the polarization dependent gain difference a predetermined value or more (for example, 0.15), continuous gain control without a kink can be realized while a stable single mode oscillation can be obtained by the DFB laser 4 as the light source of control light in gain control operation.

Next, a manufacturing method of the optical amplifying device in accordance with this Embodiment will be described with reference to FIG. 1(*b*) to FIG. 1(*d*).

Here, FIG. 1(*b*) shows a cross sectional structure of the SOAs 2, 3, FIG. 1(*c*) shows a cross sectional structure of the DFB laser 4 and FIG. 1(*d*) shows a cross sectional structure of the optical waveguide.

At first, as shown in FIG. 1(*a*) to FIG. 1(*c*), a n-InP cladding layer 21 (for example, thickness of 1 μm or less), a diffraction grating layer (InGaAsP layer; for example, emission wavelength 1.2 μm, for example, thickness is 60 nm) 22 and n-InP cap layer (for example, thickness is 10 nm) 23 are formed on a n type InP substrate (n-InP substrate) 20 by growth utilizing metal organic vapor phase epitaxy method (MOVPE method).

Next, SiO$_2$ film is formed on entire surface, and after photo resist is coated, a diffraction grating pattern (for example, grating period 236 nm) is drawn and its patterning is performed only at a region for the DFB laser 4 [See FIG. 1(*a*)] by electron beam (EB) exposure, thereby SiO$_2$ mask is formed. Then, a diffraction grating, for example, whose depth is 60 nm, is formed by dry etching method, for example, such as RIE method and the like. After the SiO$_2$ mask is removed, the formed diffraction grating is buried by n-InP. This part becomes one portion of n-InP cap layer 23. By these steps, the diffraction grating is formed only at a region of the DFB laser 4 [See, FIG. 1(*a*)] of InGaAsP diffraction grating layer 22.

Next, as shown in FIG. 1(*b*), a stacked structure including active layer, of which SOAs 2, 3 are composed, is formed by growth of lower side SCH layer 24 (InGaAsP layer; light guiding layer; for example, emission wavelength 1.2 μm, for example, thickness 100 nm), strained bulk active layer 25 (InGaAs layer; for example, strained amount –0.24%; for example, thickness 50 nm), upper side SCH layer 26 (InGaAsP layer; light guiding layer; for example, emission wavelength 1.2 μm; for example, thickness 100 nm), and p-InP cladding layer 27 (for example, thickness 300 nm) utilizing, for example, metal organic vapor phase epitaxy method (MOVPE method).

Next, SiO$_2$ mask (dielectric mask) are formed only at regions of the SOAs 2, 3 [See, FIG. 1(*a*)], and while these regions are left, all other regions are removed just before n-InP cap layer 23 (that is, from surface side p-InP cladding layer 27 to lower side SCH layer 24) utilizing, for example, wet etching method.

And on the removed region, as shown in FIG. 1(c), a stacked structure including active layer, of which the DFB laser 4 is composed is formed by butt-joint growth of lower side SCH layer 24 (InGaAsP layer; light guiding layer; for example, emission wavelength 1.2 μm; for example, thickness 100 nm), strained MQW active layer 28 (for example, emission wavelength 1.58 μm; for example, strained amount +0.8%; for example, thickness 50 nm), upper side SCH layer 26 (InGaAsP layer; for example, emission wavelength 1.2 μm; for example, thickness 100 nm), and p-InP cladding layer 27 (for example, thickness 300 nm) utilizing, for example, MOVPE method.

As described above, in this Embodiment the stacked structure including active layer of the DFB laser 4 are arranged to be formed in different steps for the stacked structure including active layer of the SOAs 2, 3. That is, gain mediums for the SOAs 2, 3 and gain medium for the DFB laser 4 are configured to be independently (separately) formed, respectively.

Next, SiO$_2$ mask (dielectric mask) are formed only at regions of the SOAs 2, 3 and the DFB laser 4 [See, FIG. 1(a)], and while these regions are left, all other regions are removed just before n-InP cap layer 23 (that is, from the surface side p-InP cladding layer 27 to lower side SCH layer 24) utilizing, for example, wet etching method.

Next, as shown in FIG. 1(d), a waveguide layer 29 (InGaAsP layer; for example, emission wavelength 1.3 μm; for example, thickness 200 nm), and p-InP cladding layer 27 (for example, thickness 350 nm) are formed by butt-joint growth utilizing, for example, MOVPE method and the like, a stacked structure, which includes two arms 11, 12 of the symmetrical Mach-Zehnder interferometer 1, waveguides 5 (5A, 5B) for control light, input waveguide 13 and output waveguide 14, is formed on regions which are connected to those of the SOAs 2, 3 and the DFB laser 4.

Next, SiO$_2$ mask are formed only at regions of the SOAs 2, 3 and the DFB laser 4, and regions for optical waveguides, and waveguide mesa structure with, for example, height 1.5 μm and width 1.5 μm are formed by dry etching such as, for example, ICP-RIE (Inductively Coupled Plasma Reactive Ion Etching) method and the like [See FIG. 1(a) to FIG. 1(d)].

Next, as shown in FIG. 1(b) to FIG. 1(d), p-InP current blocking layer (first current blocking layer) 30 and n-InP current blocking layer (second current blocking layer) 31 are formed at the opposite sides of the mesa structure utilizing, for example MOVPE method, thereby a current blocking structure is formed.

And after the SiO$_2$ mask is removed, as shown in FIG. 1(b) to FIG. 1(d), p-InP cladding layer 32 (for example, thickness 3 μm), and InGaAsP contact layer 33 (for example, emission wavelength is 1.3 μm; for example, thickness is 100 nm) are formed on upper side, thereby epitaxial growth has been completed.

On the wafer that the epitaxial growth has been completed as described above, though it is not shown in the drawings, the InGaAsP contact layer 33 is removed while only regions of the SOAs 2, 3 and the DFB laser 4 are left, and electrodes are formed at surfaces of InGaAsP contact layer 33 of regions of the SOAs 2, 3 and the DFB laser 4, and back surface of n-InP substrate 1.

Further, after a cleavage is performed, as shown in FIG. 1(a), anti-reflection coating is applied on both end faces 50A, 50B of the device 50 to form anti-reflection coating films 7, 8.

For the device 50 manufactured as above described, as shown in FIG. 1(a), signal light is arranged to be input from signal light input port to input waveguide 13, and is output from signal light output port via output waveguide 14.

Therefore, by the optical amplifying device in accordance with this Embodiment, an advantage can be attained that continuous and stable gain control can be realized while polarization independent signal light amplifying characteristic is realized.

Figure 3:
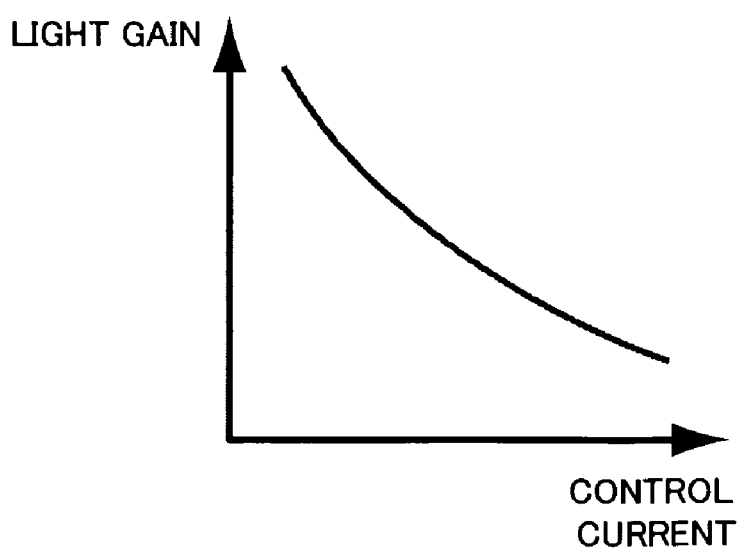
FIG. 3 is a diagram to explain an effect of the optical amplifier in accordance with Embodiment 1 of the present invention, and the diagram shows variation of light gain against control current.

That is, by this optical amplifying device, because the polarization independent type SOAs 2, 3 are disposed on arms 11, 12 of the symmetrical Mach-Zehnder interferometer 1, the polarization independent signal light amplifying characteristic is realized, and because the DFB laser 4 which has the polarization dependent gain difference of a predetermined value or more is utilized for the light source for control light, occurrence of the mode hopping can be prevented, thereby the kink caused by the mode hopping can be prevented. As a result of this, without making other characteristics of the optical amplifying device deteriorated, polarization independent and continuous gain control in which light gain (light gain by SOA) is smoothly changed against control current, is enabled [See, FIG. 3], thereby high performance optical amplifying device is realized. And at the same time it is also prevented that the control circuit becomes complicated.

Embodiment 2

Hereinafter, optical amplifying device in accordance with Embodiment 2 of the present invention and its manufacturing method will be explained with reference to FIG. 4 to FIG. 6.

The optical amplifying device in accordance with this Embodiment is different from the optical amplifying device of above described Embodiment 1 in structure of the DFB laser. That is, in above described Embodiment 1, active layer of the DFB laser has the strained MQW structure which is different from those of the SOAs in the arm, contrarily, in this Embodiment, as shown in FIG. 4, active layer 40 of the DFB laser 4 has the strained bulk structure (strained bulk active layer) which is the same as those of the SOAs 2, 3 in the arms 11, 12, but they are different in a point that thickness and strain is varied.

Here, other composition is the same as that of above described Embodiment 1. And the same elements as above described Embodiment 1 [See, FIG. 1] are given the same reference symbols in FIG. 4.

In this Embodiment, SOAs 2, 3 are configured to have strained bulk active layer 25 (InGaAs layer; for example, strain amount −0.24%; for example, thickness 50 nm) with strained bulk structure, as well as those of above described Embodiment 1 [See, FIG. 1(b)]. That is, the SOAs 2, 3 are configured to be polarization independent type optical amplifiers which have polarization independent characteristic.

Here, the phrase polarization independent type SOAs 2, 3 denote SOA in which polarization dependent gain difference ΔG (dB) is smaller than a predetermined value (for example, ΔG<2 dB; within several dB).

On the other hand, the DFB laser 4 is configured to have strained bulk active layer 40 (InGaAs layer; for example, for example, thickness 150 nm) with strained bulk structure.

In this Embodiment, a thickness of active layer 40 of the DFB laser 4 is arranged to be thicker than the thickness of active layer 25 of the SOAs 2, 3.

In this Embodiment, in order to vary the thickness of active layer 40 of the DFB laser 4 against the thickness of active layer 25 of the SOAs 2, 3, for example, it is suitable to utilize selective growth technology. That is, when active layer 40 of the DFB laser 4 is formed, for example, as shown in FIG. 5, by steps that after mask for selective growth (for example, SiO$_2$ mask) 41 is formed on portion around region where the active layer 40 is formed, active layers 25 of the SOAs 2, 3 and active layer 40 of the DFB laser 4 are grown at the same time, the thickness of active layer 40 of the DFB laser 4 can be made thicker than the thickness of active layer 25 of the SOAs 2, 3. In this Embodiment, the SiO$_2$ mask 41 has an opening portion 41A with about 20 $\mu$m width at a region of the active layer 40, and SiO$_2$ mask are formed with their width about 80 $\mu$m at the opposite sides of the opening portion 41A. Incidentally, dotted lines in FIG. 5 show waveguide which includes active layer 40 of the DFB laser 4.

Here, in this Embodiment the thickness of active layer 40 of the DFB laser 4 is arranged to be thicker under consideration of practicability, it is not limited in thicker case, however, the thickness of active layer 40 of the DFB laser 4 may be made thinner. When sum up, the thickness of active layer 40 of the DFB laser 4 is arranged to have different thickness from the thickness of active layer 25 of the polarization independent type SOAs 2, 3 by which polarization independent light gain can be obtained.

As described above, when the thickness of active layer 40 of the DFB laser 4 is varied against the thickness of active layer 25 of the polarization independent type SOAs 2, 3, it causes difference in optical confinement coefficient between polarization modes (for example, when layer thickness becomes large, optical confinement coefficient of the TM mode becomes large, thereby optical confinement difference becomes large), and as a result of this, gain difference between both polarization modes are produced.

Utilizing this effect, the DFB laser 4 as light source of control light, is configured to have a predetermined polarization dependent gain difference by means of varying thickness of active layer 40 of the DFB laser 4. In the present invention it defines that the normalized polarization dependent gain difference $\Delta\alpha$L of the DFB laser 4 is arranged to be a predetermined value (for example, about 0.15) or more ($\Delta\alpha L \geq 0.15$) in order to prevent the mode hopping between polarization at the DFB laser 4. Here, by means of selection of thickness of the strained bulk active layer 40, the polarization dependent gain difference can be arbitrarily set.

Figure 6:
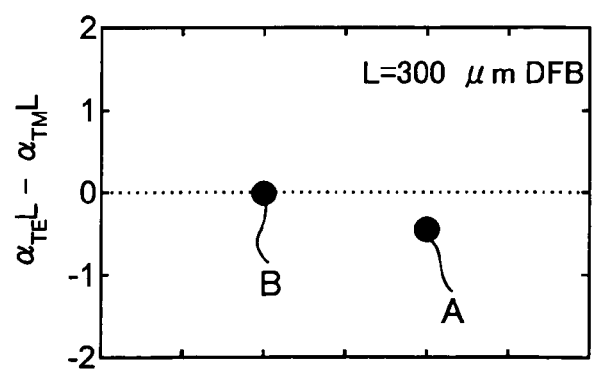
FIG. 6 is a diagram to explain polarization dependent gain difference in the DFB laser utilized in the optical amplifier in accordance with Embodiment 2 of the present invention.

For example, FIG. 6 shows the gain difference $\Delta\alpha$L ($=\alpha_{TE}L-\alpha_{TM}L$) between gain $\alpha_{TE}L$ of TE mode and gain $\alpha_{TM}L$ of TM mode when length L of the DFB laser 4 (resonator length) is 300 $\mu$m (which is normalized by resonator length).

In FIG. 6, point A denotes the gain difference $\Delta\alpha$L in a case when the thickness of active layer 40 of the DFB laser 4 is 150 nm, and point B denotes the gain difference $\Delta\alpha$L in a case when the thickness of active layer 40 of the DFB laser 4 is 50 nm.

In a case when the thickness of active layer 40 of the DFB laser 4 is 50 nm as shown point B in FIG. 6, the gain difference $\Delta\alpha$L between both polarization modes is almost 0 (zero), contrarily, in a case when the thickness of active layer 40 of the DFB laser 4 is 150 nm as shown point A in FIG. 6, the gain difference $\Delta\alpha$L between both polarization modes is about 0.45, it shows that large polarization dependent gain difference can be obtained.

In this Embodiment, active layer (gain mediums) of the SOAs 2, 3 and active layer (gain medium) of the DFB laser 4 are arranged to be the same in structure and material, but the thickness of them are different with each other. Here, when selective growth technology is utilized, the definition that thickness are made different, can be defined in another way that amount of strain are arranged to be different with each other because thickness of the active layer has a predetermined functional relation to strain amount of the active layer (for example, in selective growth of $In_{1-x}Ga_xAs$, when the thickness becomes large, amount of strain becomes larger in compression strain direction).

As described above, when the DFB laser 4 as the light source of control light is configured to have the polarization dependent gain difference a predetermined value or more (for example, 0.15), it is arranged that continuous gain control without kink can be realized while a stable single mode oscillation can be obtained by the DFB laser 4 as the light source of control light in gain control operation.

Next, a manufacturing method of the optical amplifying device in accordance with this Embodiment will be described with ad libitum reference to FIG. 4. Here, FIG. 4 shows a cross sectional structure of the DFB laser 4.

At first, by the same manner as above described in Embodiment 1 a diffraction grating layer is formed, and the formed diffraction grating is buried by n-InP.

Figure 5:
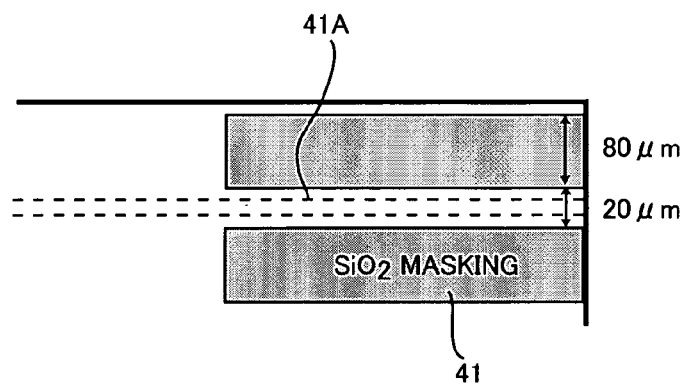
FIG. 5 is a schematic plan view to explain forming method of active layer of the DFB laser included in the optical amplifier in accordance with Embodiment 2 of the present invention.

Next, for example, as shown in FIG. 5, a mask for selective growth (for example, SiO$_2$ mask) 41 which has opening portion 41A with about 20 $\mu$m width at a region of the active layer 40, and which are formed with their width about 80 $\mu$m at the opposite sides of the aperture portion 41A, is formed on portion around region of the DFB laser 4 [See FIG. 1(a)].

And in this state, a stacked structure including active layer, of which the SOAs 2, 3 are composed, is formed by growth of lower side SCH layer 24 (InGaAsP layer; light guiding layer; for example, emission wavelength 1.2 $\mu$m; for example, thickness 100 nm), strained bulk active layer 25 (InGaAs layer; for example, strained amount −0.24%; for example, thickness 50 nm), upper side SCH layer 26 (InGaAsP layer; light guiding layer; for example, emission wavelength 1.2 $\mu$m; for example, thickness 100 nm), and p-InP cladding layer 27 (for example, thickness 300 nm) utilizing, for example, metal organic vapor phase epitaxy method (MOVPE method) [See, FIG. 1(b)].

Figure 4:
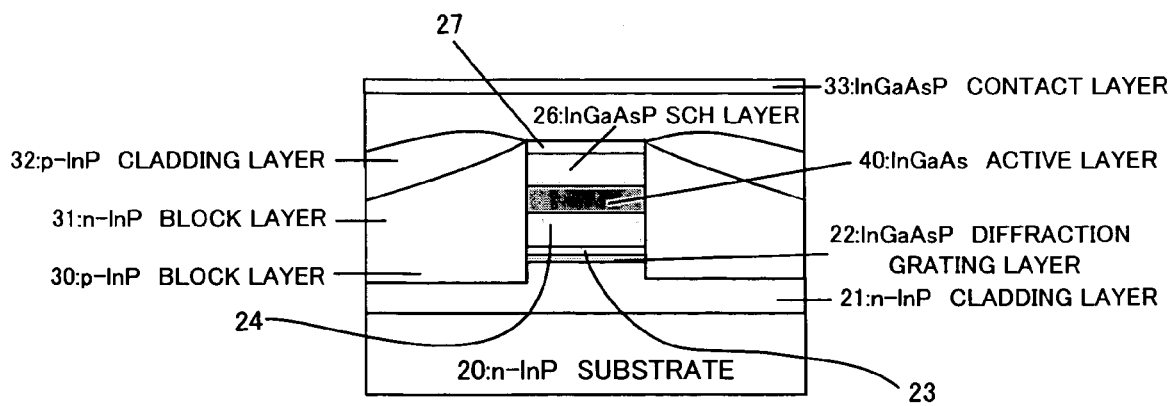
FIG. 4 is a schematic cross sectional view to show structure of DFB laser included in an optical amplifier in accordance with Embodiment 2 of the present invention.

In this Embodiment, because stacked structure of the SOAs 2, 3 and stacked structure of the DFB laser 4 are the same other than thickness and strain of the active layers, stacked structure of the DFB laser 4 is formed by selective growth technology, as shown in FIG. 4, at the same time when stacked structure of the SOAs 2, 3 are formed.

In this case, because selective growth mask 41 is formed on the region around the DFB laser 4 as described above, the thickness of respective layers of the DFB laser 4 become larger than respective layers of the SOAs 2, 3. Especially, the thickness of strained bulk active layer 40 (InGaAs layer) of the DFB laser 4 becomes, for example, about 150 nm, and it is much thicker than thickness of strained bulk active layer 25 of the SOAs 2, 3 which have thickness of about 50 nm.

As described above, in this Embodiment, the stacked structure including active layers of the SOAs 2, 3 and the stacked structure including active layers of the DFB laser 4 are to be formed with the same time growth utilizing selective growth technology. That is, gain mediums of the SOAs 2, 3 and gain medium of the DFB laser 4 are arranged to be formed at the same time.

Next, after the selective growth mask 41 is removed, $SiO_2$ mask (dielectric material mask) are formed only at regions of the SOAs 2, 3 and DFB laser 4, [See, FIG. 1(*a*)], and while these regions are left, all other regions are removed just before n-InP cap layer 23 (that is, from the surface side p-InP cladding layer 27 to the lower side SCH layer 24) by, for example, wet etching method.

Thereafter, the optical amplifying device in accordance with this Embodiment is manufactured through similar manufacturing steps of above described Embodiment 1.

Therefore, by utilizing the optical amplifying device in accordance with this Embodiment, similar operation and effect can be obtained by optical amplifying device manufactured by above described Embodiment 1.

Embodiment 3

Hereinafter, optical amplifying device in accordance with Embodiment 3 of the present invention and its manufacturing method will be explained with reference to FIG. 7.

The optical amplifying device in accordance with this Embodiment is different from the optical amplifying device of above described Embodiment 1 in light source for control light, that is, the optical amplifying device of Embodiment 1 is provided with the DFB laser as light source for control light and, contrarily, an optical amplifying device of this Embodiment is provided with a DBR (Distributed Bragg Reflector; Distributed Reflector type) laser which utilizes laser oscillation as light source for the control light.

In this Embodiment, the DBR laser 60 as light source for control light is configured to have the same stacked structure as the SOAs 2, 3 in arms [See FIG. 1(*b*)]. By this reason the DBR laser 60 is configured to have the strained bulk active layer 61 (InGaAs layer; for example, strain amount −0.24%; for example, thickness 50 nm) with strained bulk structure.

Figure 7:
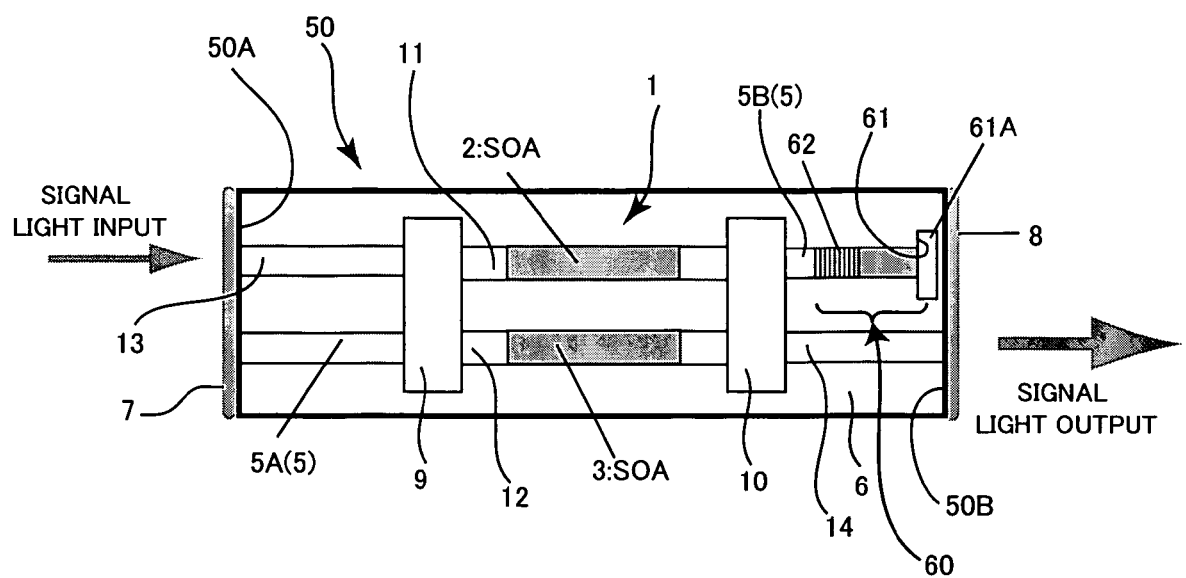
FIG. 7 is a schematic plan view to show structure of an optical amplifier in accordance with Embodiment 3 of the present invention.

This DBR laser 60 is configured as one part of the waveguide 5B for control light, as shown in FIG. 7, and is configured to have a diffraction grating 62 and an end face mirror 61 which is disposed at end face of the waveguide 5B for control light, as reflection mechanism.

Here, the end face mirror 61 may be configured as an etched mirror which is made by means of, for example, etching a hole portion 61A at a position with a predetermined distance from an end face 50B of the device in a region including the waveguide 5B for control light.

In this Embodiment, it is defined that though on both end faces 50A, 50B of the device 50 the anti-reflection coating are applied as the device of Embodiment 1 as above described, however, on end face of the end face mirror 61 the anti-reflection coating is not applied.

In this case, reflection coefficient of the end face mirror 61 is arranged larger in TE mode than in TM mode (TE mode>TM mode). That is, light loss of the control light in a reflection at the end face mirror 61, is arranged larger in TM mode than in TE mode (TE mode<TM mode). By means of utilizing polarization dependent gain loss of the end face mirror 61, the DBR laser 60 is configured to have a predetermined polarization dependent gain loss.

As described above, when the DBR laser 60 as the light source for control light is configured to have a predetermined polarization dependent gain loss, it is arranged that continuous gain control without a kink can be realized while a stable single mode oscillation of TE mode can be obtained by the DBR laser 60 as the light source of control light in gain control operation. Here, other structures of the device are the same as the device of Embodiment 1. And, the same elements as above described Embodiment 1 [See, FIG. 1(*a*) to FIG. 1(*d*)] are given the same reference symbols in FIG. 7.

Next, a manufacturing method of the optical amplifying device in accordance with this Embodiment will be described with reference to FIG. 7.

At first, by the same manner as above described in Embodiment 1, a n-InP cladding layer 21, a diffraction grating layer 22 and a n-InP cap layer 23 are formed on a n-InP substrate 20.

Next, $SiO_2$ film is formed on entire surface, and after photo resist is coated, a diffraction grating pattern (for example, its grating period is 236 nm) is drawn and its patterning is performed only at an inside region for the DBR laser 60 (symmetrical Mach-Zehnder interferometer 1 side region; diffraction grating region) [See FIG. 7] utilizing electron beam (EB) exposure, and $SiO_2$ mask is formed. Then a diffraction grating 62 is formed, for example, whose depth is 60 nm by dry etching method, for example, such as RIE method and the like. And after the $SiO_2$ mask is removed, the formed diffraction grating 62 is buried by n-InP, and this part becomes one portion of n-InP cap layer 23. By these steps, the diffraction grating 62 is formed only at the inside region for the DBR laser 60 [See, FIG. 7] of the InGaAsP diffraction grating layer 22.

Next, by the same manner as above described in Embodiment 1 [See, FIG. 1(*b*)], a stacked structure including active layer, of which SOAs 2, 3 are composed, and a stacked structure including active layer, of which the DBR laser 60 is composed, are formed by growth of lower side SCH layer 24 (InGaAsP layer; light guiding layer; for example, emission wavelength is 1.2 μm; for example, thickness 100 nm), strained bulk active layer 25 (InGaAs layer; for example, strained amount −0.24%; for example, thickness 50 nm), upper side SCH layer 26 (InGaAsP layer; light guiding layer; for example, emission wavelength 1.2 μm; for example, thickness 100 nm), and p-InP cladding layer 27 (for example, thickness 300 nm), utilizing, for example, metal organic vapor phase epitaxy method (MOVPE method).

As described above, in this Embodiment, the stacked structure including active layers of the SOAs 2, 3 and the stacked structure including active layer of the DBR laser 60 are arranged to be formed with the same time growth. That is, gain mediums of the SOAs 2, 3 and gain medium of the DBR laser 60 are arranged to be formed at the same time.

Next, by the same manner as above described in Embodiment 1, $SiO_2$ mask (dielectric mask) are formed only at regions of the SOAs 2, 3 and the DBR laser 60, [See, FIG. 7], and while these regions are left, all other regions are removed just before n-InP cap layer 23 (that is, from the surface side p-InP cladding layer 27 to lower side SCH layer 24) by for example, wet etching method.

Next, by the same manner as above described in Embodiment 1 [See, FIG. 1(*d*)], a waveguide layer 29 (InGaAsP layer; for example, emission wavelength 1.3 μm; for example, thickness 200 nm), and p-InP cladding layer 27 (for example, thickness 350 nm) are formed by butt-joint growth utilizing, for example, MOVPE method, a stacked structure, which includes two arms 11, 12 of the symmetrical Mach-Zehnder interferometer 1, waveguide 5 (5A, 5B) for control light, input waveguide 13 and output waveguide 14, is formed on regions which are connected to those of the SOAs 2, 3 and DBR laser 60.

Thereafter, through similar manufacturing steps as described above in Embodiment 1, electrodes are formed at surfaces of InGaAsP contact layer 33 of regions of the SOAs 2, 3 and the DBR laser 60, and back surface of n-InP substrate 1.

Then, in this Embodiment, a SiO$_2$ mask (insulating mask) which has opening portion in upper region of the waveguide 5B for control light, is formed at the outside region of the DBR laser 60 region (end face 50B side region; end face mirror region), and a position with a predetermined distance from end face 50B of the device. Next, as shown in FIG. 7, a hole portion 61A is formed with, for example, depth 5 μm, utilizing dry etching such as, for example, ICP-RIE method and the like. Wall surface of the hole portion 61A formed through above described steps becomes end face of the waveguide 5B for control light, thereby the end face mirror 61 as an etched mirror is formed.

Further, after a cleavage is performed, as shown in FIG. 1(a), the anti-reflection coating are applied on both end faces 50A, 50B of the device 50 to form the anti-reflection coating films 7, 8, and the optical amplifying device in accordance with this Embodiment is manufactured.

Therefore, by utilizing the optical amplifying device in accordance with this Embodiment, similar operation and effect to those by optical amplifying device manufactured by above described Embodiment 1, can be also obtained.

The optical amplifying devices (optical amplifying element) in accordance with Embodiment 4 and Embodiment 5, which hereinafter will be described are configured to prevent the polarization mode hopping of control light by means that laser oscillation of control light is arranged not to occur in entire of the device or at a portion of the device, thereby the device is configured to realize continuous gain control by means that the kink caused by the polarization mode hopping is prevented.

Embodiment 4

An explanation on the optical amplifying device in accordance with Embodiment 4 of the present invention will be given with reference to FIG. 8(a) to FIG. 8(c).

Figure 8A:
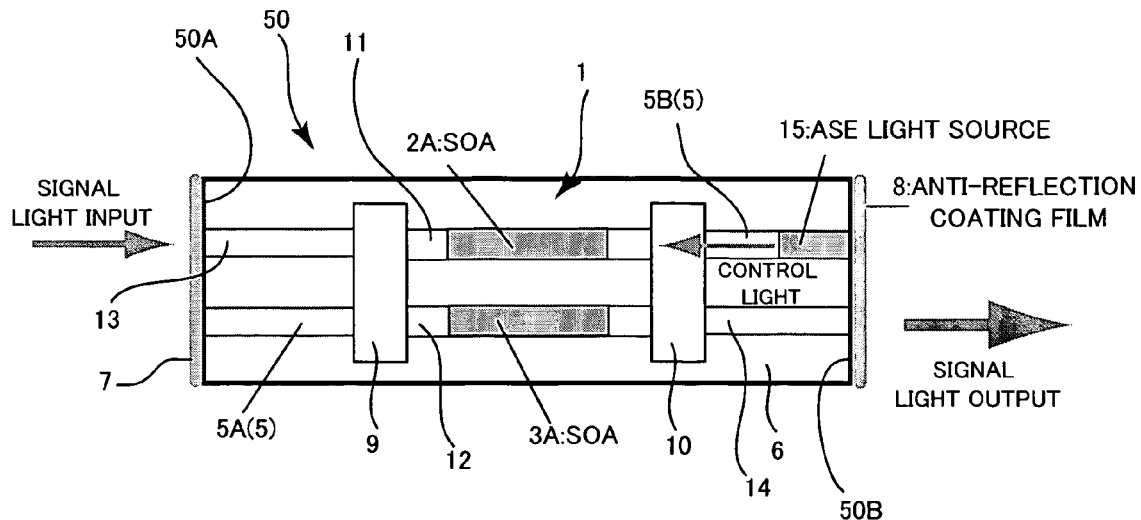

This optical amplifying device is an optical amplifying device which has a function of gain control utilizing injection of control light, and which includes a symmetrical Mach-Zehnder interferometer 1, two semiconductor optical amplifiers (SOA; first and second optical amplifier) 2A, 3A that amplify signal light, an ASE light source (light source for control light) 15 which outputs Amplified Spontaneous Emission (ASE) as control light, and a waveguide 5 for control light (ASE light) which is configured to guide the control light output from the ASE light 15, all of which are disposed on the same semiconductor substrate 6, as shown in FIG. 8(a).

Further, in this Embodiment, in order not to oscillate the control light, both end faces (end face of input side for signal light and end face of output side for signal light) of the device 50A, 50B, are covered with anti-reflection coating, respectively. That is, on both end faces 50A, 50B of the device 50, anti-reflection coating films 7, 8 (reflection coefficient R; for example, R<0.001%) are formed respectively, as shown in FIG. 8(a).

Here, the symmetrical Mach-Zehnder interferometer 1 has a symmetrical structure and includes two 3 dB couplers (for example, 2×2 3 dB couplers) 9, 10 and a pair of arms 11, 12 which are connected to the 3 dB couplers and which have the same length of light path, as shown in FIG. 8(a). Here, in the two 3 dB couplers one coupler which is disposed in input side of the signal light is referred to as an input side 3 dB coupler (input side coupler) 9, and other coupler which is disposed in output side of the signal light is referred to as an output side 3 dB coupler (output side coupler) 10.

Further, on the pair of arms 11, 12 as shown in FIG. 8(a), the polarization independent type SOAs 2A, 3A are disposed, respectively. That is, two SOAs 2A, 3A which have polarization independent characteristic, are disposed inside of the symmetrical Mach-Zehnder interferometer 1. These SOAs 2A, 3A are configured to have the same length (same SOA length). Here, the polarization independent type SOAs 2A, 3A denote SOA in which polarization dependent gain difference $\Delta G$ (dB) is smaller than a predetermined value (for example, $\Delta G<2$ dB; within several dB).

Further, to the symmetrical Mach-Zehnder interferometer 1, an input waveguide 13 to input signal light and an output waveguide 14 to output signal light are connected respectively, as shown in FIG. 8(a). That is, the input waveguide 13 is connected to the input side 3 dB coupler 9 of the Mach-Zehnder interferometer 1 and the output waveguide 14 is connected to the output side 3 dB coupler 10 of the Mach-Zehnder interferometer 1. And, because phase condition in both arms 11, 12 are the same (functionally symmetrical) in the Mach-Zehnder interferometer 1, the signal light input from the input waveguide 13, is arranged to be output from the output waveguide 14 which is disposed in a symmetrical position.

Still further, to the Mach-Zehnder interferometer 1, a waveguide 5 for control light is connected, as shown in FIG. 8(a). This waveguide 5 for control light has a waveguide portion (input side portion) 5A which is connected to the input side 3 dB coupler 9 and a waveguide portion (output side portion) 5B which is connected to the output side 3 dB coupler 10, as shown in FIG. 8(a). The control light is input from the output side portion 5B. Here, the control light is arranged to propagate in the inverse direction to the input light, and the route (light path) in which the signal light propagates intersects with the route (light path) in which the control light propagates, each other.

Further, the input side portion 5A of waveguide 5 for the control light extends to the end face 50A of signal light input side of the device 50, and the output side portion 5B of waveguide for the control light extends to the end face 50B of signal light output side of the device 50. As above described, because the anti-reflection coating films 7, 8 are formed on both end faces 50A, 50B of the device 50, it is resulted that the anti-reflection coating films 7, 8 are formed on both end faces of the waveguides 5 (5A, 5B) for control light.

The ASE light source 15 is disposed at the waveguide portion 5B which is connected to the output side 3 dB coupler 10 of waveguide 5 for control light. The ASE light source 15 which has not any reflection mechanism such as diffraction grating and the like, that is, which does not utilize oscillation (laser oscillation) to output light is disposed outside of the symmetrical Mach-Zehnder interferometer 1. As described above, it is arranged to prevent the mode hopping which is specific to the laser oscillation phenomenon, by means of utilizing ASE light source 15 as the light source for control light in order not to occur the laser oscillation in any portion of the device 50.

Here, though in this Embodiment the ASE light source 15 is utilized as the light source for control light, the light source is not limited to this and any light source can be utilized as far as it does not use the oscillation.

The control light output from the ASE light source 15 is ASE light which has wide wavelength spread, however, a mutual gain modulation effect is generated between the signal light when the control light is input to the SOAs 2A, 3A in the arms 11, 12. By this reason, gain of signal light by the SOAs 2A, 3A can be suppressed by utilizing this mutual gain modulation effect.

Because of this, gain control of SOAs 2A, 3A can be realized by changing of light amount of the ASE light which input into the SOAs 2A, 3A by means of injection current control and the like to the ASE light source 15.

By the way, in this Embodiment, light gain which is obtained by the control light on the light path, is arranged to be smaller than loss which is obtained by the control light on the light path while the control light is guided in a light path (waveguide 5 for control light and symmetrical Mach-Zehnder interferometer 1).

To be more precise, in this Embodiment, the laser oscillation within the device 50 are made not to occur by means of designing that the SOAs 2A, 3A, the ASE light source 15 and the anti-reflection coating films 7, 8 which are included in the optical amplifying device are configured to fulfill a relation $G_1+G_2<L+10*\log(R)$ when gains of the SOAs 2A, 3A are $G_1$ (dB), gain of the ASE light source 15 is $G_2$ (dB), light loss of the control light in one way of optical waveguide through which the control light is guided (waveguide 5 and symmetrical Mach-Zehnder interferometer 1; light path of control light) is L (dB) and reflection coefficient of the anti-reflection coating films 7, 8 are R. Here, the ASE light source 15 comprises one portion of the light path.

As described above in this Embodiment, the mode hopping which is specific to the laser oscillation phenomenon, is fundamentally cleared by means that the laser oscillation is arranged not to occur in entire device 50 and at the same time by means that the laser oscillation is arranged not to occur in any part within the device 50 utilizing the ASE light source 15 which does not use oscillation as light source for control light.

Here, it is preferable that composition wavelength of the gain medium utilizing for the ASE light source 15 is set in longer wavelength side than the gain mediums utilizing for the two SOAs 2A, 3A. In other words, it is preferable that an emission peak wavelength of active layer of the ASE light source 15 is set in longer wavelength side than an emission peak wavelength of active layers of the two SOAs 2A, 3A. By this arrangement, gain control efficiency can be increased.

In order for emission wavelength of the ASE light source 15 to become longer than emission wavelength of the SOAs 2A, 3A, for example, it should be performed that active layers of the SOAs 2A, 3A and active layer of the ASE light source 15 are grown at the same time, for example, utilizing selective growth technology. Here, as will be described later for manufacturing method of optical amplifying device in accordance with Embodiment 5, the emission wavelength of the ASE light source 15 can also be made longer than emission wavelength of the SOAs 2A, 3A, by means that active layers of the SOAs 2A, 3A and active layer of the ASE light source 15 are separately made utilizing butt-joint growth.

Next, a manufacturing method of the optical amplifying device in accordance with this Embodiment will be described with reference to FIG. 8(b) and FIG. 8(c).

Figure 8B:
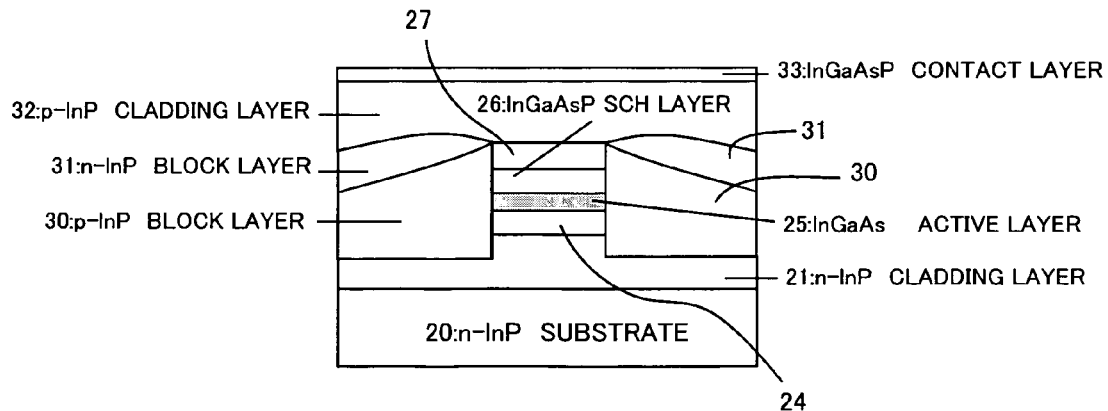
Figure 8C:
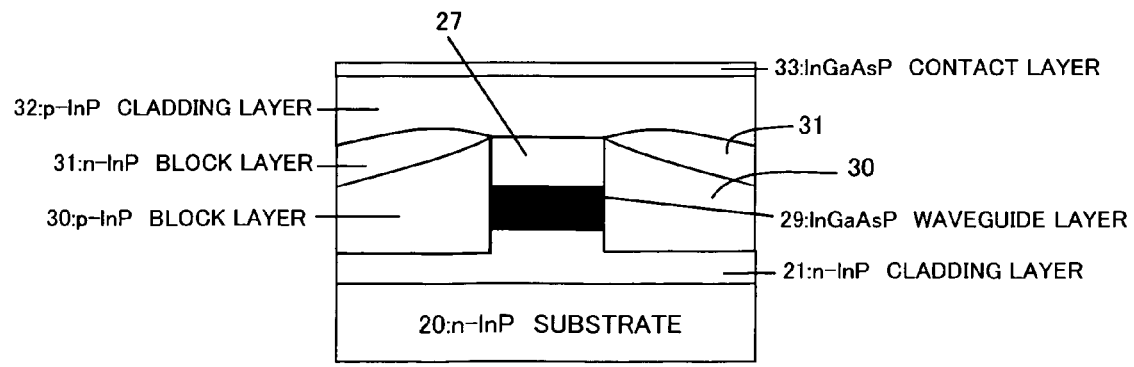

Here, FIG. 8(b) shows a cross sectional structure of the SOAs 2A, 3A and the ASE light source 15, and FIG. 8(c) shows a cross sectional structure of the optical waveguide.

At first, as shown in FIG. 8(b), a stacked structure including active layer, of which the SOAs 2A, 3A, and the ASE light source 15 are composed, is formed by growth of n-InP cladding layer 21 (for example, thickness less than 1 μm), lower side SCH layer 24 (InGaAsP layer; light guiding layer; for example, emission wavelength 1.2 μm; for example, thickness 100 nm), strained bulk active layer 25 (InGaAs layer; for example, strained amount −0.24%; for example, thickness 50 nm), upper side SCH layer 26 (InGaAsP layer; light guiding layer; for example, emission wavelength 1.2 μm; for example, thickness 100 nm), and p-InP cladding layer 27 (for example, thickness 300 nm) on n type InP substrate (n-InP substrate) 20, for example, utilizing metal organic vapor phase epitaxy method (MOVPE method).

As above described, in this Embodiment, the two SOAs 2A, 3A and the ASE light source 15 have the same semiconductor stacked structure. That is, in this Embodiment an element which has the same stacked structure as the SOAs 2A, 3A is used as the ASE light source 15.

Next, $SiO_2$ mask (dielectric mask) are formed only at regions of the SOAs 2A, 3A and the ASE light source 15 [See, FIG. 8(a)], and while these regions are left, all other regions are removed just before n-InP cladding layer 21 (that is, from p-InP cladding layer 27 of surface side to lower side SCH layer 22), by for example, wet etching method.

Then on the removed region, as shown in FIG. 8(c), a waveguide layer 29 (InGaAsP layer; for example, emission wavelength 1.3 μm; for example, thickness 200 nm), and p-InP cladding layer 27 (for example, thickness 350 nm) are formed by butt-joint growth utilizing, for example, MOVPE method, a stacked structure, which includes two arms 11, 12 of the symmetrical Mach-Zehnder interferometer 1, the waveguide 5 (5A, 5B) for control light, the input waveguide 13 and the output waveguide 14, is formed in a region which is connected to that of the SOAs 2A, 3A and the ASE light source 15.

Next, $SiO_2$ mask is formed only at regions of the SOAs 2A, 3A and the ASE light source 15, and regions for optical waveguides, and a waveguide mesa structure with, for example, height 1.5 μm and width 1.5 μm are formed by dry etching such as, for example, ICP-RIE (Inductively Coupled Plasma Reactive Ion Etching) method and the like [See, FIG. 8(a) to FIG. 8(c)].

Next, as shown in FIG. 8(b) and FIG. 8(c), a current blocking structure is formed which is composed of p-InP current blocking layer (first current blocking layer) 30 and n-InP current blocking layer (second current blocking layer) 31 which are grown at the opposite sides of the mesa structure utilizing, for example, MOVPE method.

And after the $SiO_2$ mask is removed, as shown in FIG. 8(b) and FIG. 8(c), p-InP cladding layer 32 (for example, thickness 3 μm), and InGaAsP contact layer 33 (for example, emission wavelength 1.3 μm; for example, thickness 100 nm) are formed on upper side, and epitaxial growth has been completed.

On the wafer that the epitaxial growth has been completed as described above, though it is not shown in the drawings, the InGaAsP contact layer 33 is removed while only regions of the SOAs 2A, 3A and the ASE light source 15 are left, and electrodes are formed at front surfaces of InGaAsP contact layer 33 of regions of the SOAs 2, 3 and the ASE light source 15, and back surface of n-InP substrate 1.

Further, after a cleavage is performed, as shown in FIG. 8(a), anti-reflection coating are applied on both end faces 50A, 50B of the device 50 to form anti-reflection coating films 7, 8.

For the device 50 manufactured as above described, as shown in FIG. 8(a), signal light is arranged to be input from signal light input port to the input waveguide 13, and is output from signal light output port via the output waveguide 14.

Therefore, by the optical amplifying device in accordance with this Embodiment, an advantage can be attained that continuous and stable gain control can be realized while polarization independent signal light amplifying characteristic is realized.

That is, by this optical amplifying device, because polarization independent type SOAs 2A, 3A are disposed on the arms 11, 12 of the symmetrical Mach-Zehnder interferometer 1, the polarization independent signal light amplifying characteristic is realized, and because the ASE light source 15 is utilized for the light source for control light, and light gain which is obtained by the ASE light as control light in light path is arranged to be set smaller than light loss which is got by the control light in light path, it is realized that laser oscillation of the control light can be prevented in entire device or in any portion of the device, and then occurrence of polarization mode hopping is arranged to be prevented, thereby the kink caused by the polarization mode hopping can be prevented. As a result of this, without making other characteristics of the optical amplifying device deteriorated, continuous gain control which is polarization independent and in which light gain (light gain by SOA) is smoothly changed against control current, is enabled [See, FIG. 3], thereby high performance optical amplifying device is made to be realized. And at the same time it is also prevented that the control circuit becomes complicated.

Embodiment 5

Hereinafter, optical amplifying device in accordance with Embodiment 5 of the present invention and its manufacturing method will be explained with reference to FIG. 9.

The optical amplifying device in accordance with this Embodiment is different from that of above described Embodiment 4 in its structure of the ASE light source. That is, in above described Embodiment 4 active layer of the ASE light source is arranged to have strained bulk structure which is quite the same as that of the SOAs in arms, in this Embodiment, contrarily, as shown in FIG. 9, active layer 42 of the ASE light source 15 is arranged to have the MQW structure which is different from those of the SOAs 2A, 3A in arms 11, 12.

Here, other structure is quite the same as that of above described Embodiment 4. And the same elements as above described Embodiment 4 [See, FIG. 8(a) to FIG. 8(c)] are given the same reference symbols in FIG. 9.

Next, a manufacturing method of the optical amplifying device in accordance with this Embodiment will be described with ad libitum reference to FIG. 9. Here, FIG. 9 shows a cross sectional structure of the ASE light source 15.

At first, as above described in Embodiment 4, a stacked structure including active layers, of which the SOAs 2A, 3A are composed, is formed by growth of n-InP cladding layer 21 (for example, thickness less than 1 $\mu$m), lower side SCH layer 24 (InGaAsP layer; light guiding layer; for example, emission wavelength 1.2 $\mu$m; for example, thickness 100 nm), strained bulk active layer 25 (InGaAs layer; for example, strained amount −0.24%; for example, thickness 50 nm), upper side SCH layer 26 (InGaAsP layer; light guiding layer; for example, emission wavelength 1.2 $\mu$m; for example, thickness 100 nm), and p-InP cladding layer 27 (for example, thickness 300 nm) on n type InP substrate (n-InP substrate) 20, for example, utilizing for example, metal organic vapor phase epitaxy method (MOVPE method) [See FIG. 8(b)].

Next, SiO$_2$ mask (dielectric material mask) is formed only at regions of the SOAs 2A, 3A [See, FIG. 8(a)], and while these regions are left, all other regions are removed just before n-InP cladding layer 21 (that is, from p-InP cladding layer 27 of surface side to lower side SCH layer 24) by, for example, wet etching method.

Figure 9:
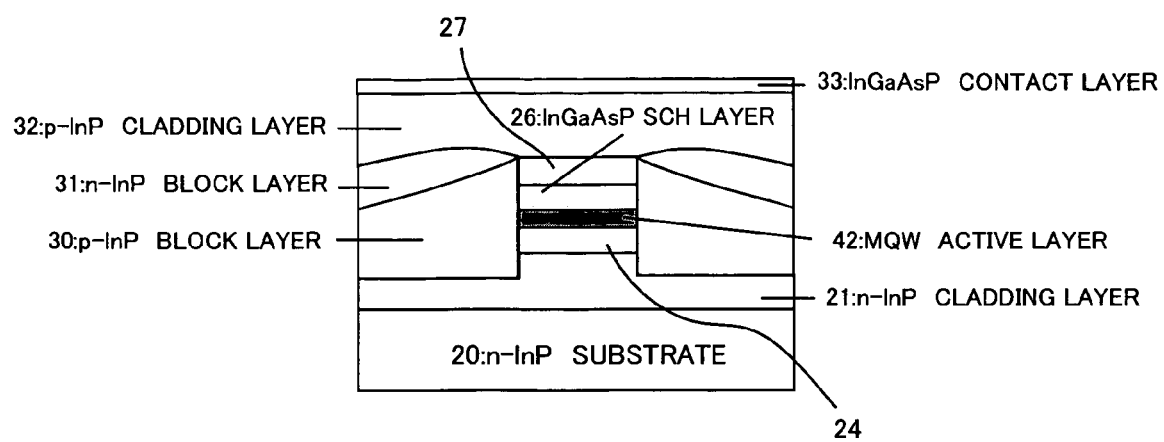
FIG. 9 is a schematic cross sectional view to show structure of ASE light source included in an optical amplifier in accordance with Embodiment 5 of the present invention.
Figure 10:
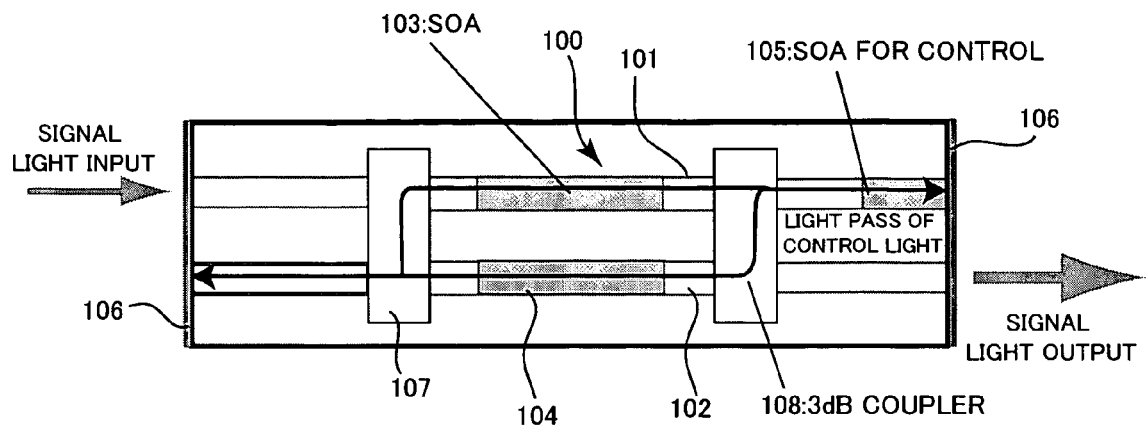
FIG. 10 is a diagram to explain structure of a conventional optical amplifier.
Figure 11:
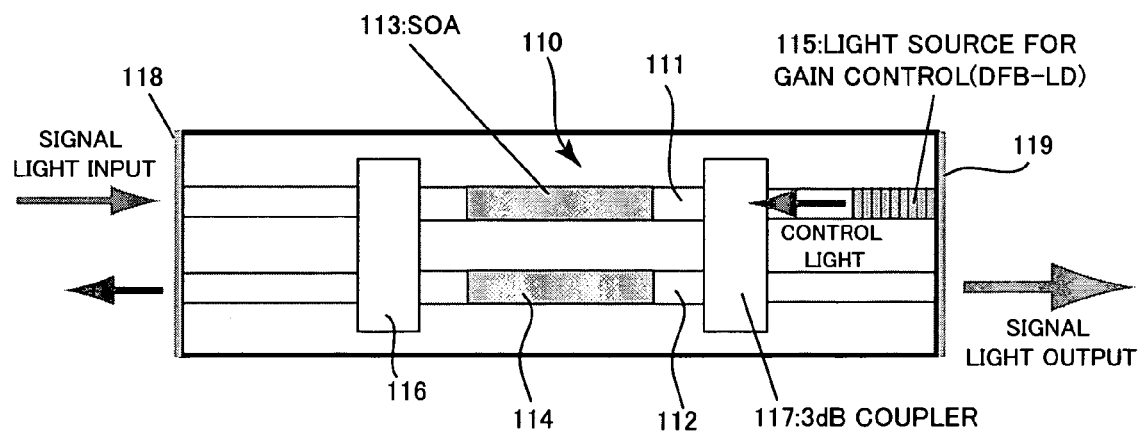
FIG. 11 is a diagram to explain structure of a conventional optical amplifier.
Figure 12:
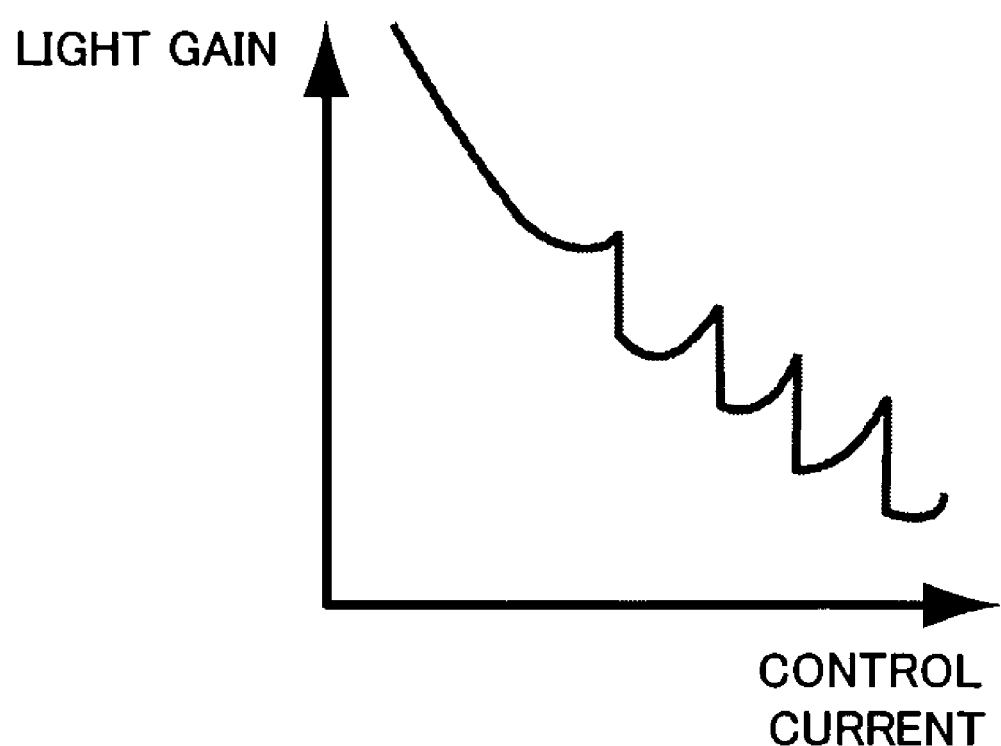
FIG. 12 is a diagram to explain a problem of a conventional optical amplifier, and the diagram shows variation of light gain against control current.

Next, at a region where the ASE light source 15 is formed [See, FIG. 8(a)], as shown in FIG. 9, a stacked structure including active layer, of which the ASE light source 15 is composed, is formed by butt-joint growth of lower side SCH layer 24 (InGaAsP layer; light guiding layer; for example, emission wavelength is 1.2 $\mu$m; for example, thickness 100 nm), MQW active layer 42 (for example, emission wavelength 1.61 $\mu$m; for example, thickness 50 nm), upper side SCH layer 26 (InGaAsP layer; for example, emission wavelength 1.2 $\mu$m; for example, thickness 100 nm), and p-InP cladding layer 27 (for example, thickness 300 nm), for example, utilizing MOVPE method.

Thereafter through a manufacturing steps similar to those of above describe Embodiment 4, the optical amplifying device in accordance with this Embodiment is provided.

Therefore, by the optical amplifying device in accordance with this Embodiment, the same operation and effect can be realized as those of above described Embodiment 4.

Especially in this Embodiment, because active layers of the SOAs 2A, 3A can be made different in structure from active layer of the ASE light source 15, composition wavelength of gain medium for the ASE light source 15 can be set longer side than composition wavelength of gain mediums for the SOAs 2A, 3A. That is, peak emission wavelength of active layer of the ASE light source 15 can be set in longer side than peak emission wavelength of active layers of the two SOAs 2A, 3A. By this arrangement, gain control efficiency can be improved.

In addition, when active layers of the SOAs 2A, 3A and active layer of the ASE light source 15 are grown at the same time by selective growth technology, because active layers of the SOAs 2A, 3A can be made different in structure from active layer of the ASE light source 15, emission wavelength of the ASE light source 15 can be made longer than emission wavelength of the SOAs 2A, 3A, thereby gain control efficiency can be improved.

Here, manufacturing methods for the optical amplifying devices in accordance with above described respective Embodiments are shown as only examples and they may be manufactured utilizing other growing technology and processes. For example, selective growth technology may be utilized. Further, layer structures of above described optical amplifying devices are also shown as only examples, other layer structures may be applicable. For example, in above described Embodiments the optical amplifying devices are formed of InGaAsP/InP related materials, however, other materials such as InAlGaAs/InP related material may be also used. Further, stacked structure with other composition may be formed on p type substrate or semi insulating substrate.

Still further, in above described Embodiments, as current blocking structure in waveguide structure of SOAs 2, 2A, 3, 3A, DFB laser 4, ASE light source 15 and optical waveguide, buried hetero structure (BH structure) is employed, however, they are not limited to this structure and, for example, high mesa structure, ridge structure, semi insulating buried hetero structure (SI-BH structure), semi insulating planar buried hetero structure (SI-PBH structure) and the like may be also used.

Further, in above described Embodiments, in order to suppress noise increasing in the amplifying device, the signal light and the control light are arranged to propagate in the reverse direction each other for SOAs 2, 2A, 3, 3A in arms. It is not also limited to this, for example, the control light and the signal light may propagate in the same direction. In such case the light source for control light should be disposed in input side portion 5A of the waveguide 5 for control light.

Still further, in above described Embodiments, a Mach-Zehnder interferometer which has the same arm length and the same SOA length is employed as Mach-Zehnder interferometer, however, it is not limited to this. For example, Mach-Zehnder interferometer of asymmetrical structure which has a pair of arms with different length, also may be employed. For example, a Mach-Zehnder interferometer of asymmetrical structure which has SOAs with different length (having different SOA length) may be also employed. In such case, it is preferable that phase adjuster (phase controller, phase shifter) is disposed at one side of arm or both sides of arms. Here, the phase adjuster (phase controller, phase shifter) can be integrated by forming an electrode to inject current at a portion of the waveguide.

The present invention should not be limited in the structure shown in above described Embodiments and other portion in the specification, variations and modification of the invention will be apparent to those of ordinary skill in the art without departing from scope of the present invention.

What is claimed is:

1. An optical amplifying device comprising:
   a Mach-Zehnder interferometer including an input side coupler, an output side coupler and a pair of arms that connect said input side coupler and said output side coupler;
   a first and a second optical amplifier to amplify signal light, which are provided on said pair of arms respectively;
   a light source for control light to output control light, wherein
      said first and said second optical amplifier are configured to have polarization independent characteristics, and wherein
      said light source for control light is configured to have at least one of a predetermined polarization dependent gain difference and a predetermined polarization dependent loss difference.

2. The optical amplifying device according to claim 1, wherein gain medium of said first and said second optical amplifier and gain medium of said light source for control light, are configured to be different in at least one of structure thereof and material thereof.

3. The optical amplifying device according to claim 2, wherein said first and said second optical amplifier are configured to have an active layer of strained bulk structure, and wherein said light source for control light is configured to have an active layer of strained multiple quantum well structure.

4. The optical amplifying device according to claim 1, wherein the gain medium of said first and said second optical amplifier and gain medium of said light source for control light, are configured to be different in at least one of thickness thereof and amount of stain thereof.

5. The optical amplifying device according to claim 4, wherein each of said first and said second optical amplifier and said light source for control light, is configured to have an active layer of strained bulk structure, respectively.

6. The optical amplifying device according to claim 1, wherein said light source for control light is a laser utilizing laser oscillation.

7. The optical amplifying device according to claim 6, wherein said light source for control light is a distributed feedback type laser having a predetermined polarization dependent gain difference.

8. The optical amplifying device according to claim 6, wherein said light source for control light is a distributed reflector type laser which is provided with end face mirror having a predetermined polarization dependent loss difference.

9. The optical amplifying device according to claim 1, further comprising
   a waveguide for control light to be connected to said output side coupler, and wherein
   said light source for control light is provided on said waveguide for control light.

10. The optical amplifying device according to claim 1, wherein all of said Mach-Zehnder interferometer, said first and said second optical amplifier and said light source for control light are provided on the same semiconductor substrate.

11. An optical amplifying device comprising:
    a Mach-Zehnder interferometer including an input side coupler, an output side coupler and a pair of arms that connect said input side coupler and said output side coupler;
    a first and a second optical amplifier to amplify signal light, which are provided on said pair of arms respectively;
    a light source for control light to output control light, wherein
       said first and said second optical amplifier are configured such that a polarization dependent gain difference $\Delta G$ thereof is smaller than 2 dB, respectively, and wherein
       said light source for control light is configured such that a normalized polarization dependent gain difference $\Delta \alpha L$ thereof is 0.15 or more.

12. An optical amplifying device comprising:
    a Mach-Zehnder interferometer including an input side coupler, an output side coupler and a pair of arms that connect said input side coupler and said output side coupler;
    a first and a second optical amplifier to amplify signal light, which are provided on said pair of arms respectively;
    a light source for control light to output control light without utilizing oscillation; and
    a waveguide for control light connected to said Mach-Zehnder interferometer for guiding control light which is output from said light source for control light, wherein
       light gain obtained by said control light when the control light is guided through said waveguide for control light and said Mach-Zehnder interferometer, is configured to be smaller than light loss obtained by the control light.

13. The optical amplifying device according to claim 12, wherein said light source for control light is an Amplified Spontaneous Emission light source that outputs Amplified Spontaneous Emission light as the control light.

14. The optical amplifying device according to claim 12, wherein a component wavelength of gain medium used for said light source for control light, is set in longer wavelength side than a component wavelength of gain medium used for said first and said second optical amplifier.

15. The optical amplifying device according to claim 12, wherein said optical amplifiers are polarization independent type optical amplifiers.

16. The optical amplifying device according to claim 12, wherein an end face of said waveguide for control light is provided with an anti-reflection coating film.

17. The optical amplifying device according to claim 16, wherein the optical amplifying device is configured to have relationship that $G_1+G_2<L+10 *\log(R)$, where
   $G_1$ is gain of said first and second amplifiers,
   $G_2$ is gain of said light source for control light,
   L is light loss in one way of light waveguide through which the control light is guided, and
   R is reflection rate of said anti-reflection coating film.

18. The optical amplifying device according to claim 12, wherein said waveguide for control light has a waveguide portion to be connected to said output side coupler, and wherein
   said light source for control light is provided on said waveguide portion.

19. The optical amplifying device according to claim 12, wherein said first and said second optical amplifier and said light source for control light, have the same semiconductor stacked structure.

20. The optical amplifying device according to claim 12, wherein said first and said second optical amplifier are configured to have active layers of strained bulk structure, and wherein said light source for control light is configured to have an active layer of strained multiple quantum well structure.

21. The optical amplifying device according to claim 12, wherein all of said Mach-Zehnder interferometer, said waveguide for control light, said first and said second optical amplifier and said light source for control light, are provided on the same semiconductor substrate.

22. The optical amplifying device according to claim 12, wherein each of said input side coupler and said output side coupler, is 2×2 3 dB coupler.

* * * * *